United States Patent
Yuda et al.

(10) Patent No.: US 6,663,715 B1
(45) Date of Patent: Dec. 16, 2003

(54) PLASMA CVD APPARATUS FOR LARGE AREA CVD FILM

(75) Inventors: Katsuhisa Yuda, Tokyo (JP); Manabu Ikemoto, Tokyo (JP)

(73) Assignees: NEC Corporation, Tokyo (JP); Anelva Corporation, Tokyo (JP)

( * ) Notice: Subject to any disclaimer, the term of this patent is extended or adjusted under 35 U.S.C. 154(b) by 0 days.

(21) Appl. No.: 09/706,818

(22) Filed: Nov. 7, 2000

(30) Foreign Application Priority Data

Nov. 10, 1999 (JP) .................................. 11/319402/1999

(51) Int. Cl.⁷ .......................... C23C 16/00; H05H 1/00
(52) U.S. Cl. ................. 118/723 ; 118/723 ER; 156/345.34; 156/345.47; 156/345.33; 156/345.36
(58) Field of Search ................. 118/723 E, 723 ER, 118/723 I, 723 IR, 723 MW; 156/345.34, 345.33, 345.47, 345.75

(56) References Cited

U.S. PATENT DOCUMENTS

| | | | |
|---|---|---|---|
| 5,336,326 A | * 8/1994 | Karner et al. | 118/723 HC |
| 5,554,255 A | * 9/1996 | Karner et al. | 427/569 |
| 5,919,332 A | * 7/1999 | Koshiishi et al. | 156/345 |
| 6,110,556 A | * 8/2000 | Bang et al. | 428/64.1 |

FOREIGN PATENT DOCUMENTS

| | | | | |
|---|---|---|---|---|
| JP | 1-86227 | 6/1989 | | |
| JP | 5-21393 | 1/1993 | | |
| JP | 7-27149 | 5/1995 | | |
| JP | 11-168094 A | * 6/1999 | | H01L/21/31 |
| JP | 11-279778 A | * 10/1999 | | C23F/4/00 |

* cited by examiner

Primary Examiner—Parviz Hassanzadeh
(74) Attorney, Agent, or Firm—Sughrue Mion, PLLC

(57) ABSTRACT

A plasma CVD apparatus includes first and second electrodes, neutral gas introduction pipes, and a plasma confining electrode interposed between the first and second electrodes separating a plasma generation region and a substrate processing region. The plasma confining electrode has a hollow structure defined by an upper electrode plate, and a lower electrode plate and is connected to the neutral gas introduction pipes. A plurality of neutral gas passage holes are provided for the lower electrode plate and the gas diffusing plates to supply neutral gas into the substrate processing region. A total opening area of the plurality of neutral gas passage holes in the gas diffusing plate on a side of the upper electrode plate is smaller than that of the plurality of neutral gas passage holes in the gas diffusing plate on a side of the lower electrode plate.

10 Claims, 14 Drawing Sheets

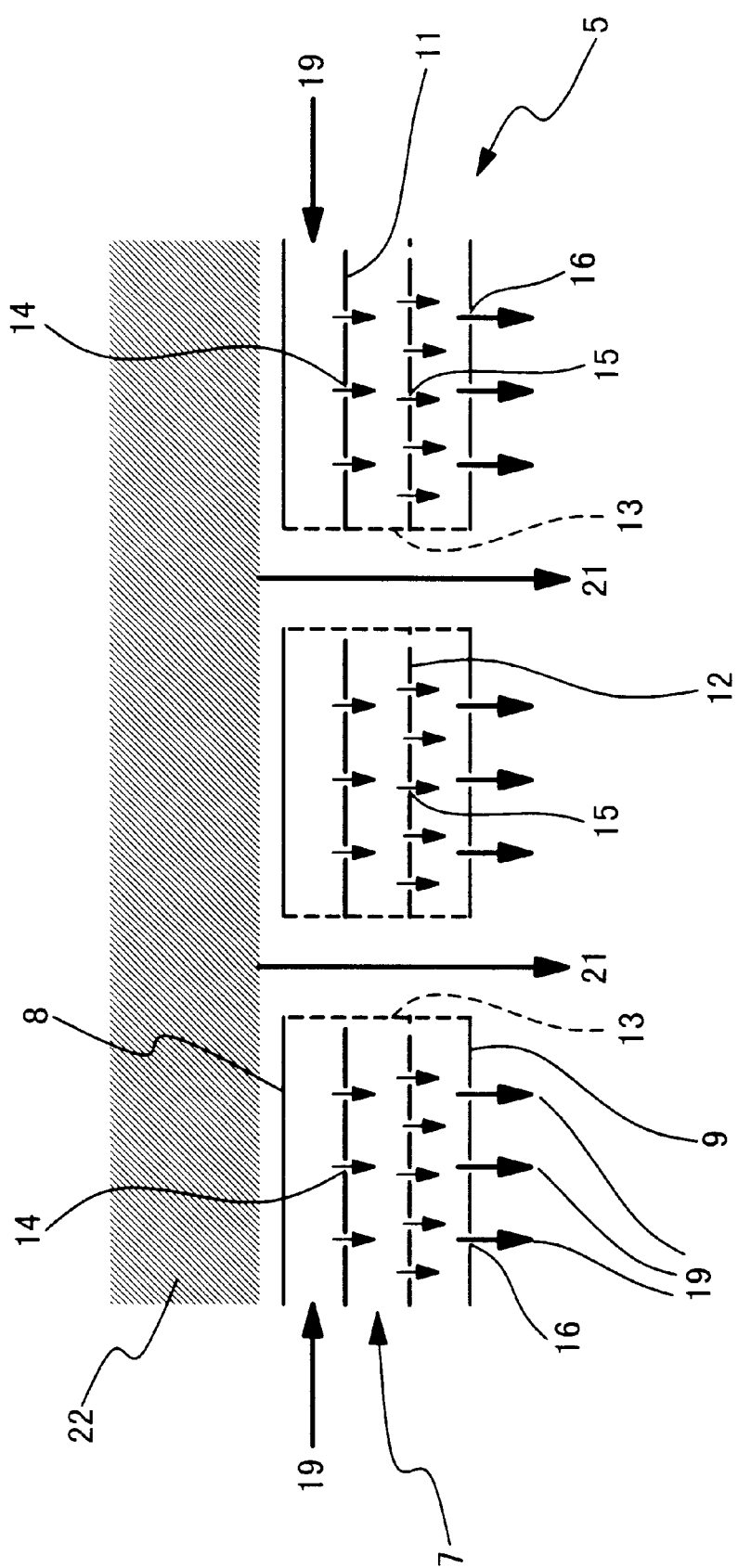

PLASMA CVD APPARATUS FOR LARGE AREA CVD FILM

BACKGROUND OF THE INVENTION

1. Field of the Invention

The present invention relates to a plasma CVD method of using a plasma CVD apparatus. More particularly, the present invention relates to a plasma CVD apparatus in which a plasma generation region and a substrate processing region are separated and which is suitable for a large area CVD film formation.

2. Description of the Related Art

As one of the plasma CVD apparatuses for forming a film on a substrate while restraining plasma damage, a remote-plasma CVD apparatus is known in which a plasma generation region and a substrate processing region are separated. A method of forming a CVD film using such a remote-plasma CVD apparatus is an important technology as the processing process to make a highly reliable device and a highly efficient device in a semiconductor device process. The remote plasma CVD apparatuses can attain the large sized substrate processes such as a large area flat panel display switching transistor forming process, a drive circuit transistor forming process and a large diameter silicon wafer process. As such a remote plasma CVD apparatus, a parallel plate remote plasma CVD apparatus is disclosed in Japanese Laid Open Patent Application (JP-A-Heisei 5-21393). As shown in FIG. 1, the parallel plate remote plasma CVD apparatus is composed of a high frequency applied electrode 101 and a counter electrode 102 on which a substrate 103 is mounted. A plasma confining electrode 108 as a mesh plate having a plurality of holes is provided between the high frequency applied electrode 101 and the counter electrode 102. Plasma 106 is confined between the high frequency applied electrode 101 and the plasma confining electrode 108. Plasma generation gases 111 are introduced between the high frequency applied electrode 101 and the plasma confining electrode 108. The vacuum chamber 107 is provided with an exhaust port 116.

Such a parallel plate remote plasma CVD apparatus using the plasma generated between parallel plates can uniformly supply radicals necessary to process a substrate in a large area. The apparatus disclosed in the above mentioned Japanese Laid Open Patent Application (JP-A-Heisei 5-21393) is provided with neutral gas injection holes 109 near the passage holes 105 for the radicals 104. The large area uniform process is possible through the reaction of the radicals 104 and the neutral gas 110. For this reason, the parallel plate remote plasma CVD apparatus is considered as a superior technique for forming a silicon oxide film and a nitride silicon film as a gate insulating film of a thin film transistor on a large sized glass substrate, an amorphous silicon film such as an active layer and a gate electrode of the thin film transistor on the large sized glass substrate, and a silicon oxide film and a nitride silicon film as an interlayer insulating film of a transistor device on a large sized silicon substrate.

As mentioned above, the neutral gas injection holes 109 are provided near the radical passage holes 105 and the neutral gas is uniformly supplied on the surface from the neutral gas injection holes 109. At this time, the plasma confining electrode 108 of a hollow structure is used, as disclosed in Japanese Laid Open Patent Application (JP-A-Heisei 5-21393). The plasma confining electrode 108 of the hollow structure is provided with the radical passage holes 105 and the neutral gas passage holes 109 independently, as shown in FIGS. 2 and 3. The radicals 104 and the neutral gas 110 are never mixed in the hollow structure.

As a method of supplying the neutral gas from the outside of a vacuum chamber 107 to the plasma confining electrode 108 of the hollow structure, various methods are considered. In a first method, the neutral gas 110 is supplied from an upper direction into the plasma confining electrode 108 through the plasma region 106 by neutral gas introduction pipes 112 as shown in FIG. 4. Also, in a second method, the neutral gas 110 is supplied from a lateral direction into the plasma confining electrode 108 as shown in FIG. 5. The method disclosed in the above-mentioned Japanese Laid Open Patent Application (JP-A-Heisei 5-21393) is of the latter.

In the first method shown in FIG. 4, the neutral gas 110 can be uniformly injected on the surface of the substrate, if a lot of neutral gas introduction pipes 112 are uniformly provided for the plasma confining electrode 108. In this case, however, the neutral gas introduction pipes 112 pass through the plasma generation region 106. As a result, abnormal discharge 117 is generated easily near the neutral gas introduction pipe on the whole of the plasma confining electrode 108, so that the plasma generating state becomes unstable.

Also, in the second method shown in FIG. 5, most of the gas is injected from the neutral gas injection holes near the connection section of the neutral gas introduction pipe 112 with the plasma confining electrode 108. As a result, because the pressure in the plasma confining electrode 108 of the hollow structure is as low pressure as tens to hundreds mtorr which is equal to a film forming pressure in the substrate processing region, the uniform gas injection on the surface is difficult, as schematically shown in FIG. 6.

To solve the above problem, it would be necessary to arrange such a gas diffusing plate as used in a gas shower head of the conventional parallel plate plasma CVD apparatus, in the inside of the plasma confining electrode 108 of the hollow structure. As shown in FIG. 7, the conventional gas shower head structure is composed of neutral gas introduction pipes 112, a diffusing plate 114 having a plurality of holes uniformly provided on the surface thereof and a gas injection plate 115 having gas injection holes uniformly on the surface thereof. In the conventional parallel plate plasma CVD apparatus, a large number of gas supply pipes can be connected to the gas shower head. Therefore, uniform gas injection is possible even in the structure as shown in FIG. 7. In this case, however, it is impossible to supply a gas to the gas shower head while avoiding the above-mentioned abnormal discharge in the remote plasma CVD apparatus. Also, it is difficult to uniformly inject the neutral gas on the surface of the substrate 103 in the method of using the gas diffusing plate as shown in FIG. 7.

In conjunction with the above description, a plasma CVD apparatus is disclosed in Japanese Laid Open Utility Model Application (JU-A-Heisei 1-86227). In this reference, the plasma CVD apparatus is composed of a box electrode, and a counter electrode. A substrate is provided between the electrodes. The box electrode has a fixed intermediate diffusing plate and a movable intermediate diffusing plate. The diffusing plates have a plurality of holes. By adjusting the position of the movable intermediate diffusing plate, the number of gas passable holes and the area of the gas passage hole are adjusted.

Also, a plasma CVD apparatus disclosed in Japanese Laid Open Utility Model Application (JU-A-Heisei 7-27149). In this reference, the plasma CVD apparatus is composed of an electrode section (2) having electrode plates (3 and 4) parallel to a wafer W and a gas introduction pipe (5). A gas G is introduced through the gas introduction pipe (5), passes through the electrode plates (3 and 4), and is supplied to the wafer W. A gas diffusing pipe (10a) is provided in parallel to the electrode plates (3 and 4) to have holes (11) in a radial direction from the gas introduction pipe (5). The gas diffusing pipe (10a) is connected to the connection end (5a) of the gas introduction pipe (5) and has the closed end.

SUMMARY OF THE INVENTION

Therefore, an object of the present invention is to provide a plasma CVD apparatus in which it is possible to uniformly inject a neutral gas on a substrate surface.

Another object of the present invention is to provide a plasma CVD apparatus in which abnormal discharge does not occur, even if a neutral gas introduction pipe is inserted into a plasma generation region.

In order to achieve an aspect of the present invention, a plasma CVD apparatus includes first and second electrodes, neutral gas introduction pipes, and a plasma confining electrode interposed between the first and second electrodes to separate a plasma generation region and a substrate processing region. The plasma confining electrode has a hollow structure defined by an upper electrode plate, and a lower electrode plate, and has gas diffusing plates provided in the hollow structure, and has radical passage holes provided to supply radicals from the plasma generation region into the substrate processing region while isolating from a neutral gas. The plasma confining electrode is connected to the neutral gas introduction pipes, and a plurality of neutral gas passage holes are provided for each of the lower electrode plate and the gas diffusing plates to supply the neutral gas into the substrate processing region. A total opening area of the plurality of neutral gas passage holes in the gas diffusing plate on a side of the upper electrode plate is smaller than that of the plurality of neutral gas passage holes in the gas diffusing plate on a side of the lower electrode plate.

Here, the number of the neutral gas passage holes in the gas diffusing plate on the side of the lower electrode plate may be more than the number of the neutral gas passage holes in the gas diffusing plate on the side of the upper electrode plate.

Also, first ones of the plurality of neutral gas passage holes in each of the gas diffusing plates may be different in diameter from second ones of the plurality of neutral gas passage holes in each of the gas diffusing plates.

Also, positions of the neutral gas passage holes in the gas diffusing plate nearer to the lower electrode plate may be different from positions of the neutral gas passage holes in the gas diffusing plate nearer to the upper electrode plate.

Also, a region of the neutral gas passage holes in the gas diffusing plate nearer to the lower electrode plate may be arranged in an outside region of a region of the neutral gas passage holes in the gas diffusing plate nearer to the upper electrode plate.

Also, the gas introduction pipes may extend from a lateral direction of the plasma confining electrode to be coupled to side portions of the plasma confining electrode. Instead, the gas introduction pipes may extend to pass through a peripheral portion of the plasma generation region to be coupled to upper portions of the plasma confining electrode.

In order to achieve another aspect of the present invention, a plasma CVD apparatus includes first and second electrodes, neutral gas introduction pipes, and a plasma confining electrode interposed between the first and second electrodes to separate a plasma generation region and a substrate processing region. The plasma confining electrode has a hollow structure defined by an upper electrode plate, and a lower electrode plate, and has gas diffusing plates provided in the hollow structure, and has radical passage holes provided to supply radicals from the plasma generation region into the substrate processing region while isolating from a neutral gas. The plasma confining electrode is connected to the neutral gas introduction pipes, and a plurality of neutral gas passage holes are provided for each of the lower electrode plate and the gas diffusing plates to supply the neutral gas into the substrate processing region. A distribution density of opening area consisting of the plurality of neutral gas passage holes is higher in a central portion of each of the gas diffusing plates than in a peripheral portion thereof.

Here, the number of the neutral gas passage holes in the gas diffusing plate on the side of the lower electrode plate may be more than the number of the neutral gas passage holes in the gas diffusing plate on the side of the upper electrode plate.

Also, first ones of the plurality of neutral gas passage holes in each of the gas diffusing plates may be different in diameter from second ones of the plurality of neutral gas passage holes in each of the gas diffusing plates.

Also, positions of the neutral gas passage holes in the gas diffusing plate nearer to the lower electrode plate may be different from positions of the neutral gas passage holes in the gas diffusing plate nearer to the upper electrode plate.

Also, a region of the neutral gas passage holes in the gas diffusing plate nearer to the lower electrode plate may be arranged in an outside region of a region of the neutral gas passage holes in the gas diffusing plate nearer to the upper electrode plate.

Also, the gas introduction pipes may extend from a lateral direction of the plasma confining electrode to be coupled to side portions of the plasma confining electrode. Instead, the gas introduction pipes may extend to pass through a peripheral portion of the plasma generation region to be coupled to upper portions of the plasma confining electrode.

In order to achieve still another aspect of the present invention, a plasma CVD apparatus includes first and second electrodes, neutral gas introduction pipes, a plasma confining electrode interposed between the first and second electrodes to separate a plasma generation region, and a gas supply section interposed between the plasma confining electrode and the second electrode to supply neutral gas. The gas supply section has a hollow structure defined by an upper plate and a lower plate, and has gas diffusing plates provided in the hollow structure, and has radical passage holes provided to supply radicals while isolating from a neutral gas. The gas supply section is connected to the neutral gas introduction pipes, and a plurality of neutral gas passage holes are provided for each of the lower plate and the gas diffusing plates to supply the neutral gas into the substrate processing region. A total opening area of the plurality of neutral gas passage holes in the gas diffusing plate on a side of the upper plate is smaller than that of the plurality of neutral gas passage holes in the gas diffusing plate on a side of the lower plate.

Here, the number of the neutral gas passage holes in the gas diffusing plate on the side of the lower gas supply section plate may be more than the number of the neutral gas passage holes in the gas diffusing plate on the side of the upper gas supply section plate.

Also, first ones of the plurality of neutral gas passage holes in each of the gas diffusing plates may be different in diameter from second ones of the plurality of neutral gas passage holes in each of the gas diffusing plates.

Also, positions of the neutral gas passage holes in the gas diffusing plate nearer to the lower gas supply section plate may be different from positions of the neutral gas passage holes in the gas diffusing plate nearer to the upper gas supply section plate.

Also, a region of the neutral gas passage holes in the gas diffusing plate nearer to the lower gas supply section plate may be arranged in an outside region of a region of the neutral gas passage holes in the gas diffusing plate nearer to the upper gas supply section plate.

Also, the gas introduction pipes may extend from a lateral direction of the gas supply section to be coupled to side portions of the gas supply section.

Also, the gas introduction pipes may extend to pass through a peripheral portion of the plasma generation region to be coupled to upper portions of the gas supply section.

In order to achieve yet still another aspect of the present invention, a plasma CVD apparatus includes first and second electrodes, neutral gas introduction pipes, a plasma confining electrode interposed between the first and second electrodes to separate a plasma generation region, and a gas supply section interposed between the plasma confining electrode and the second electrode to supply neutral gas. The gas supply section has a hollow structure defined by an upper plate and a lower plate, and has gas diffusing plates provided in the hollow structure, and has radical passage holes while isolating from a neutral gas. The gas supply section is connected to the neutral gas introduction pipes, and a plurality of neutral gas passage holes are provided for each of the lower plate and the gas diffusing plates to supply the neutral gas into the substrate processing region. A distribution density of opening area consisting of the plurality of neutral gas passage holes is higher in a central portion of each of the gas diffusing plates than in a peripheral portion thereof.

Here, the number of the neutral gas passage holes in the gas diffusing plate on the side of the lower electrode plate may be more than the number of the neutral gas passage holes in the gas diffusing plate on the side of the upper electrode plate.

Also, first ones of the plurality of neutral gas passage holes in each of the gas diffusing plates may be different in diameter from second ones of the plurality of neutral gas passage holes in each of the gas diffusing plates.

Also, positions of the neutral gas passage holes in the gas diffusing plate nearer to the lower gas supply section plate are different from positions of the neutral gas passage holes in the gas diffusing plate nearer to the upper gas supply section plate.

Also, a region of the neutral gas passage holes in the gas diffusing plate nearer to the lower gas supply section plate is arranged in an outside region of a region of the neutral gas passage holes in the gas diffusing plate nearer to the upper gas supply section plate.

Also, the gas introduction pipes may extend from a lateral direction of the plasma confining electrode to be coupled to side portions of the gas supply section.

BRIEF DESCRIPTION OF THE DRAWINGS

FIG. 9 is a cross sectional view showing a part of the plasma CVD apparatus shown FIG. 8 in detail;

DESCRIPTION OF THE PREFERRED EMBODIMENTS

A plasma CVD apparatus of the present invention will be described below in detail with reference to the attached drawings.

Figure 1:
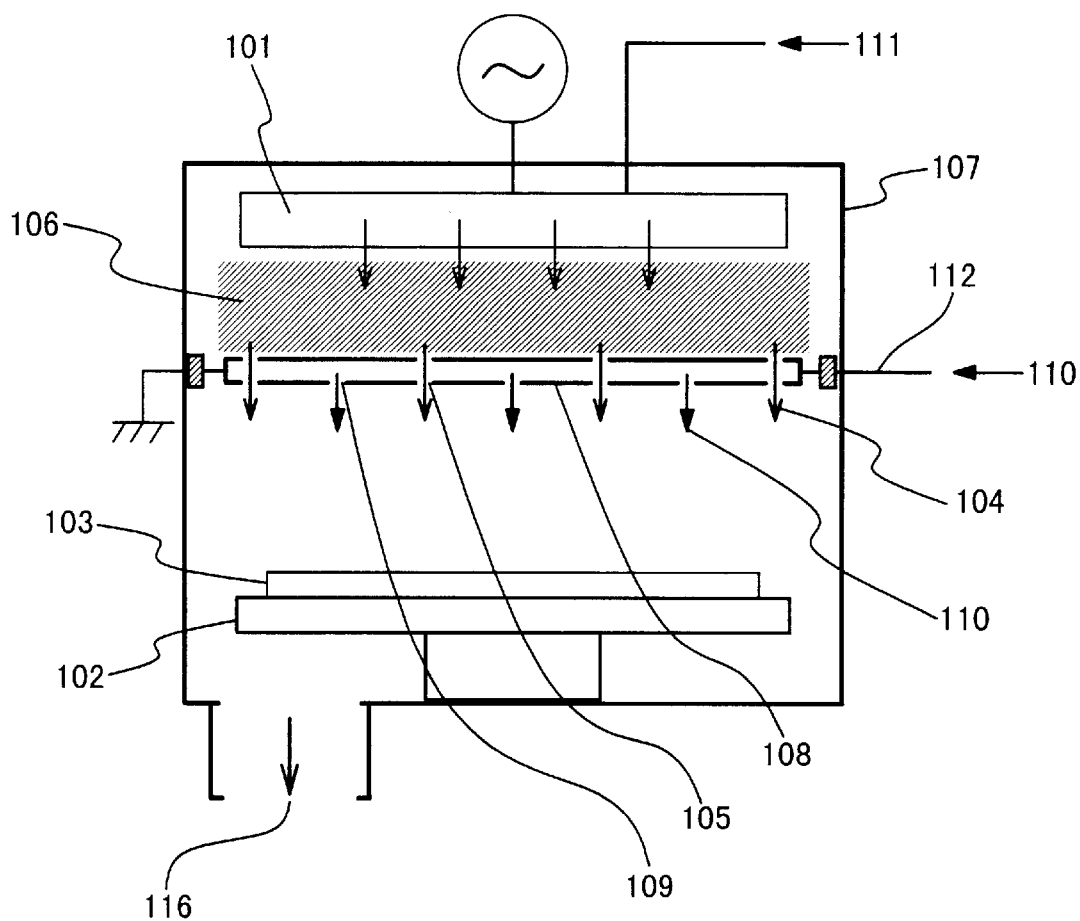
FIG. 1 is a cross sectional view of a first conventional plasma CVD apparatus.
Figure 2:
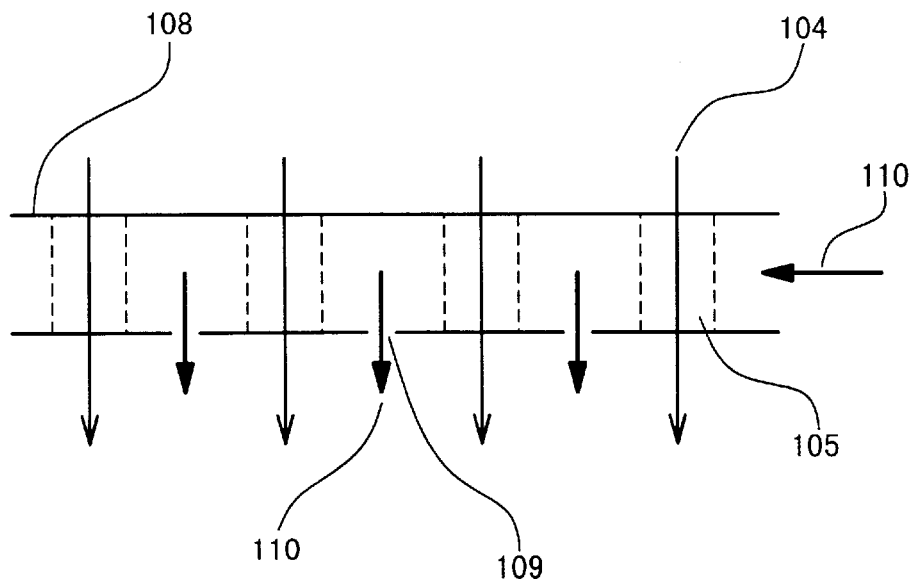
FIG. 2 is a cross section showing of a plasma confining electrode having a hollow structure in detail in the first conventional plasma CVD apparatus shown in FIG. 1.
Figure 3:
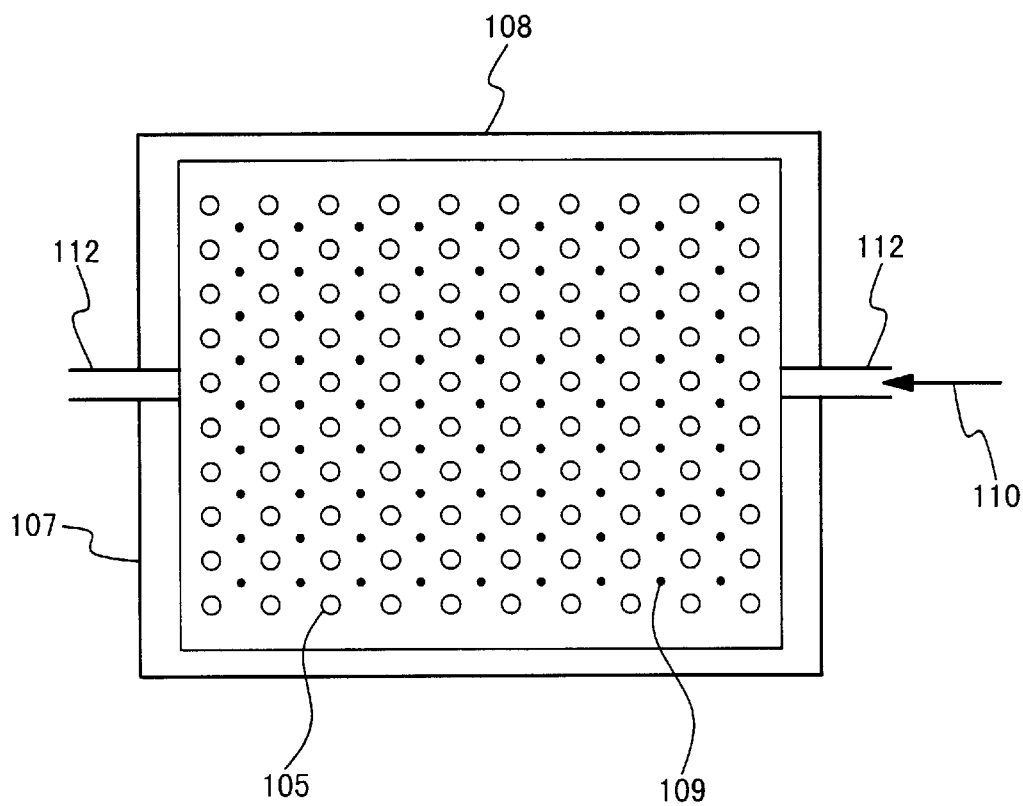
FIG. 3 is a plan view showing the plasma confining electrode having the hollow structure in the first conventional plasma CVD apparatus.
Figure 4:
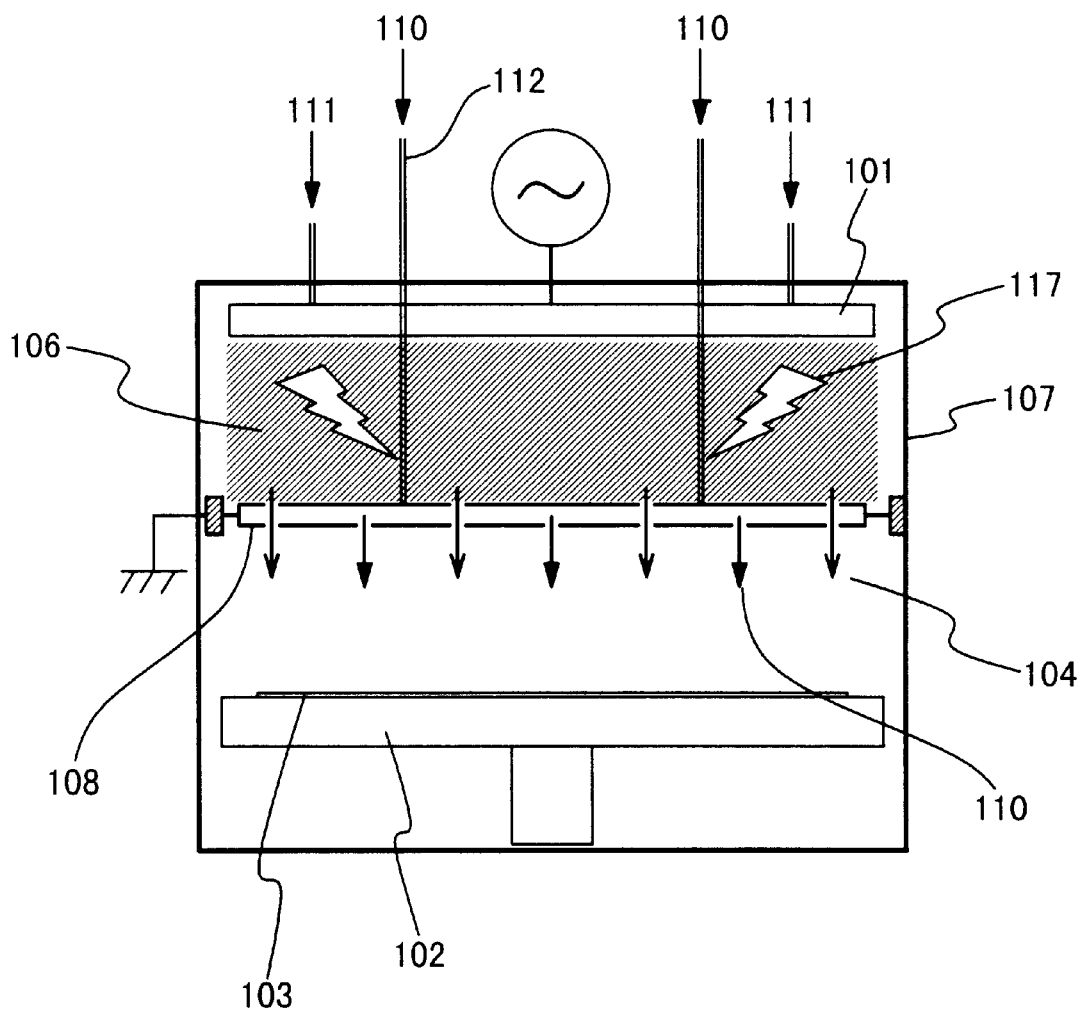
FIG. 4 is a cross sectional view showing a second conventional plasma CVD apparatus.
Figure 5:
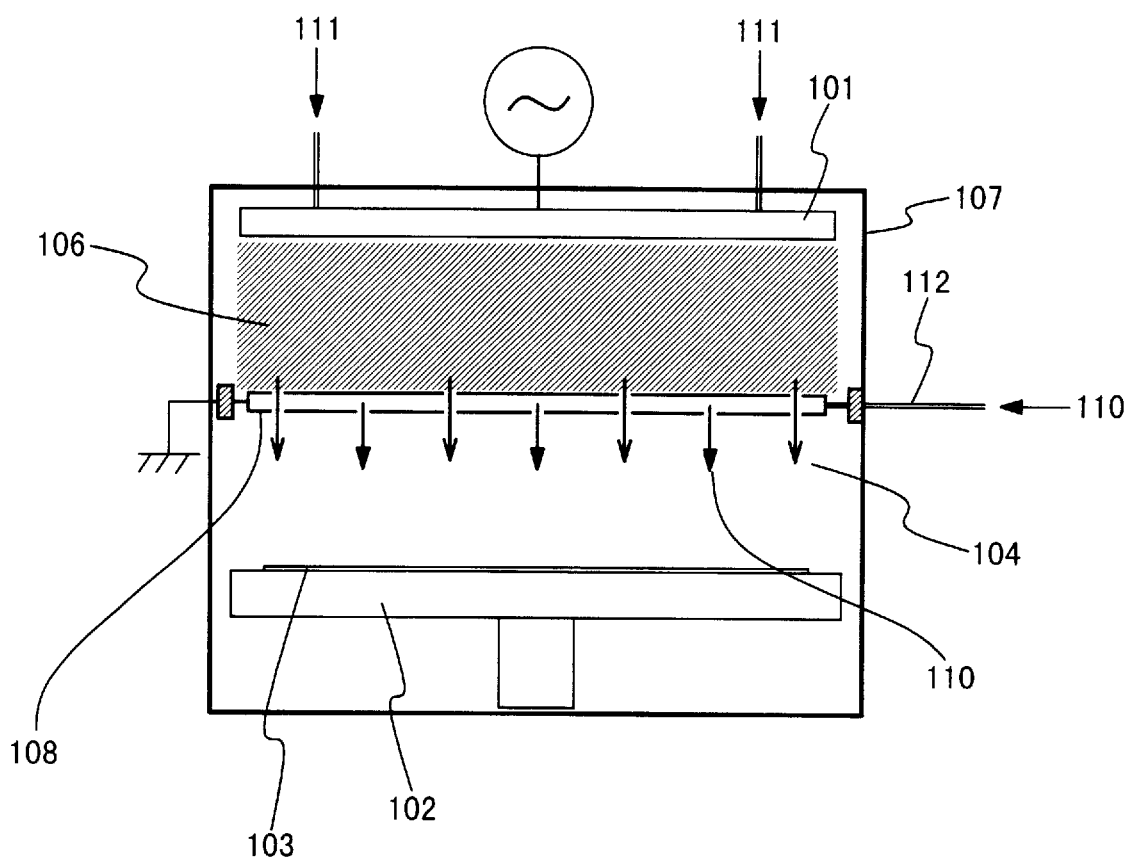
FIG. 5 is a cross sectional view showing a third conventional plasma CVD apparatus.
Figure 6:
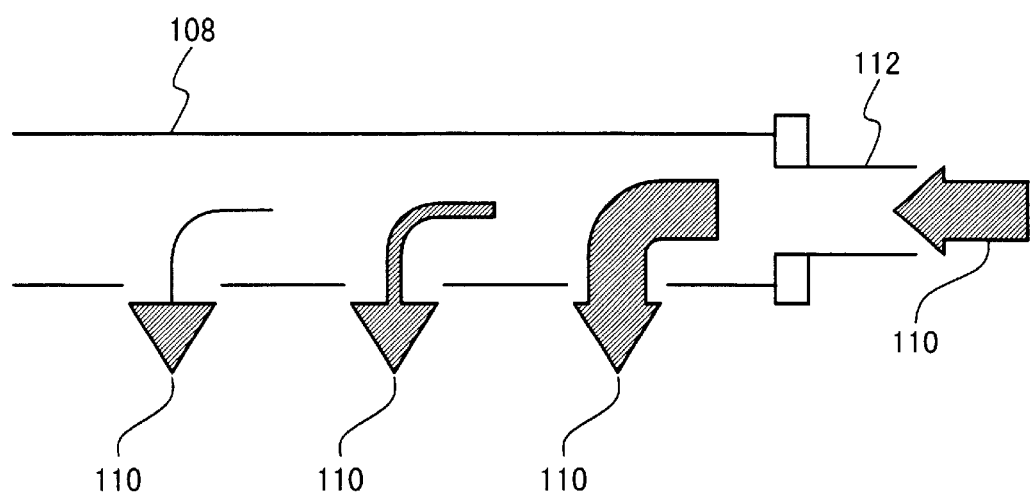
FIG. 6 is a cross sectional view showing an electrode structure in the third conventional plasma CVD apparatus in detail.
Figure 7:
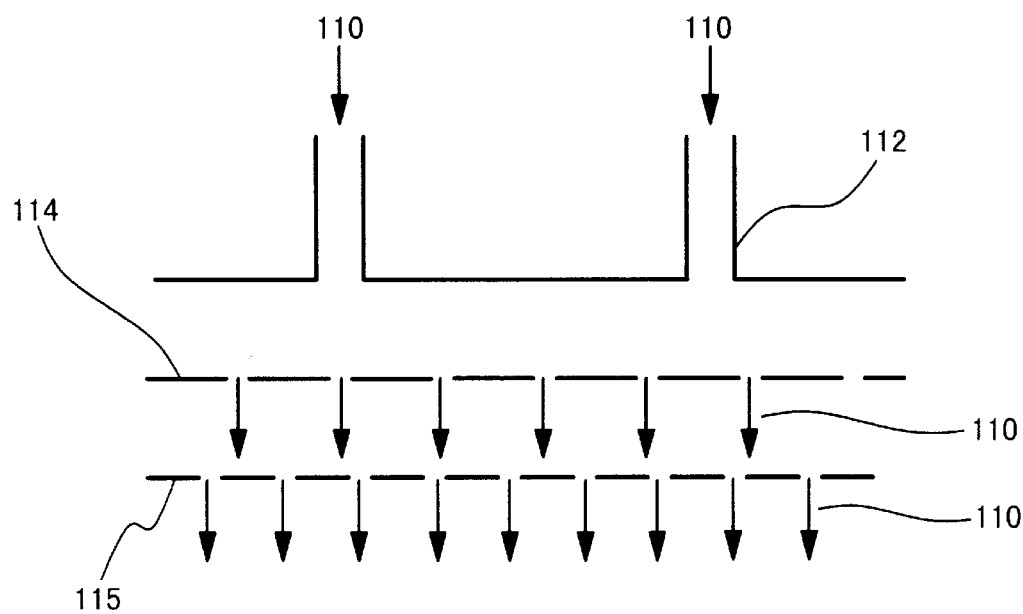
FIG. 7 is a cross sectional showing another electrode in a fourth conventional plasma CVD apparatus.
Figure 8:
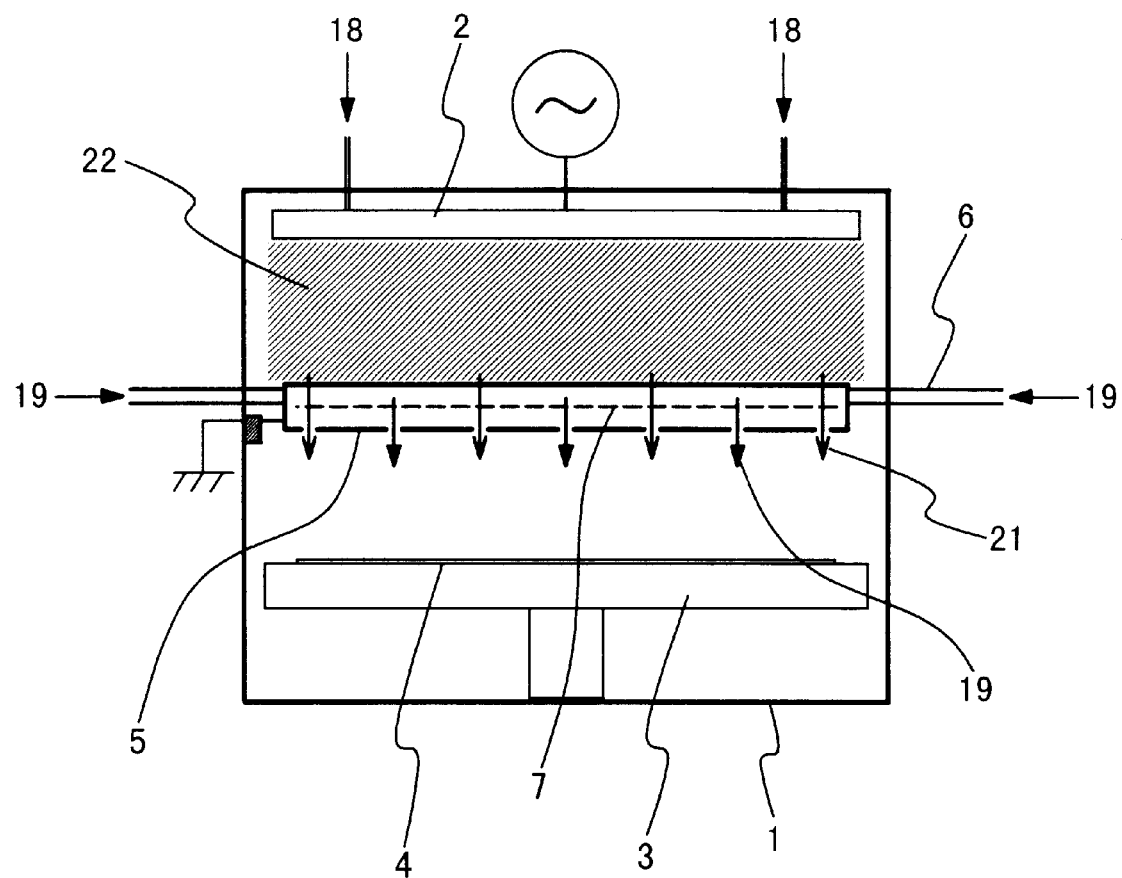
FIG. 8 is a cross sectional view showing a plasma CVD apparatus according to a first embodiment of the present invention.

FIG. 8 is a diagram showing the structure of the plasma CVD apparatus according to an embodiment of the present invention. The plasma CVD apparatus is used for the formation of a silicon oxide film, for example. Referring to FIG. 8, the plasma CVD apparatus such as a parallel plate remote plasma CVD is composed of a high frequency applied electrode 2 of a plate form, a counter electrode 3 of a plate form and a plasma confining electrode 5 which are provided in a vacuum chamber 1. The counter electrode 3 is located oppositely to the high frequency applied electrode 2 and these electrodes are parallel to each other. A substrate 4 is mounted on the surface of the counter electrode 3. The plasma confining electrode 5 is interposed between the high frequency applied electrode 2 and the counter electrode 3 to confine plasma. The plasma confining electrode 5 is grounded. Neutral gas introduction pipes 6 are inserted from the vacuum chamber 1 and are connected with the plasma confining electrode 5. The neutral gas introduction pipe 6 supplies a neutral gas into the plasma confining electrode 5. The neutral gas is a non-excited and non-ionized gas. A gas diffusing plate section 7 is arranged in the plasma confining electrode 5.

As shown in FIG. 9, the plasma confining electrode 5 is composed of a plasma confining electrode upper plate 8 and a plasma confining electrode lower plate 9. The four side planes or whole side planes of the plasma confining electrode 5 are almost closed by side plates (not shown). The gas diffusing plate section 7 is put in a space between the plasma confining electrode upper plate 8 and the plasma confining electrode lower plate 9 to uniformly diffuse the neutral gas. The gas diffusing plate section 7 is formed from a first gas diffusing plate 11 and a second gas diffusing plate 12.

The plasma confining electrode 5 has a plurality of radical passage holes 13. The plurality of radical passage holes 13 are formed such that the radicals can flow through the plasma confining electrode 5 into a lower direction. The plurality of radical passage holes 13 are provided and arranged to have a suitable distribution of the holes 13 such that the radicals can diffuse in a uniform surface density. The radical passage hole 13 is designed to have a diameter equal to or less than twice of the Debye length of a generated oxygen plasma such that it is possible to confine the generated oxygen plasma efficiently.

The first gas diffusing plate 11 has a plurality of first neutral gas passage holes 14, and second gas diffusing plate 12 has a plurality of second neutral gas passage holes 15. A plurality of third neutral gas passage holes 16 are formed in the plasma confining electrode lower plate 9.

Figure 10A:
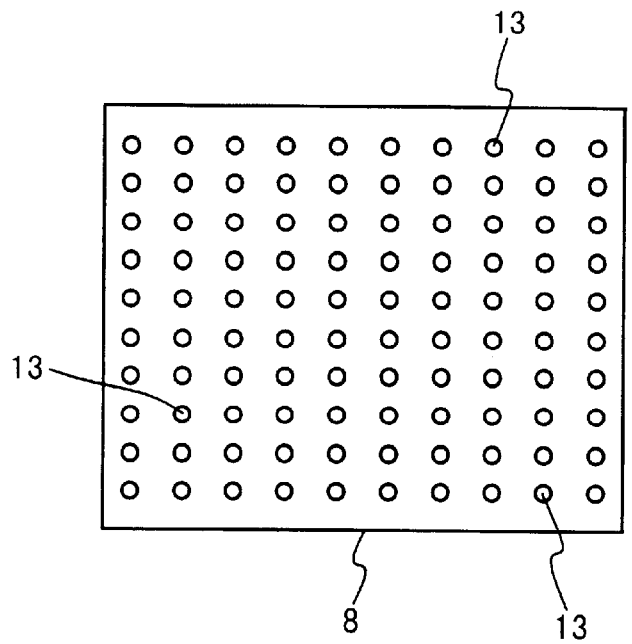
FIGS. 10A and 10B are plan views showing an upper plate and lower plate of an electrode, respectively.
Figure 10B:
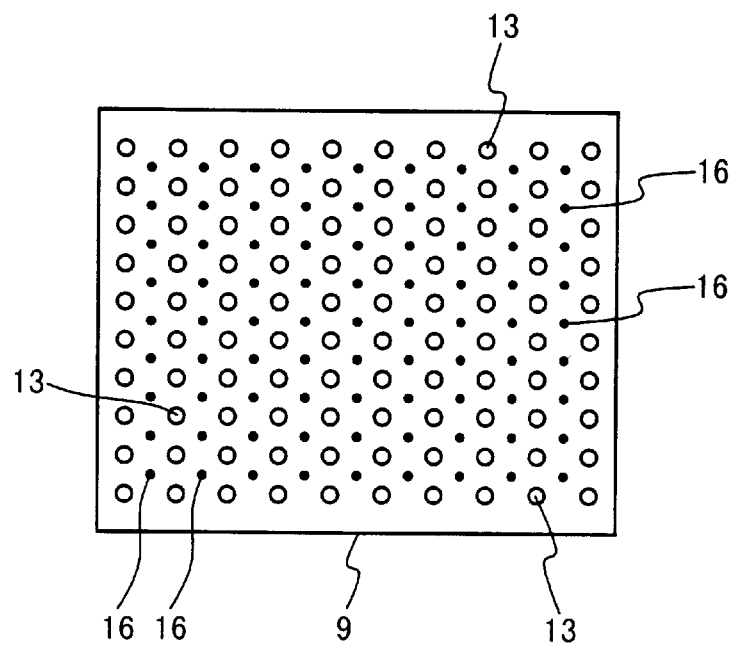

FIGS. 10A and 10B show examples of the holes formed on the plasma confining electrode upper plate 8 and the plasma confining electrode lower plate 9, respectively. The radical passage holes 13 are uniformly formed in the plasma confining electrode upper plate 8. The radical passage holes 13 and the third neutral gas passage holes 16 are uniformly formed in the plasma confining electrode lower plate 9.

Figure 11A:
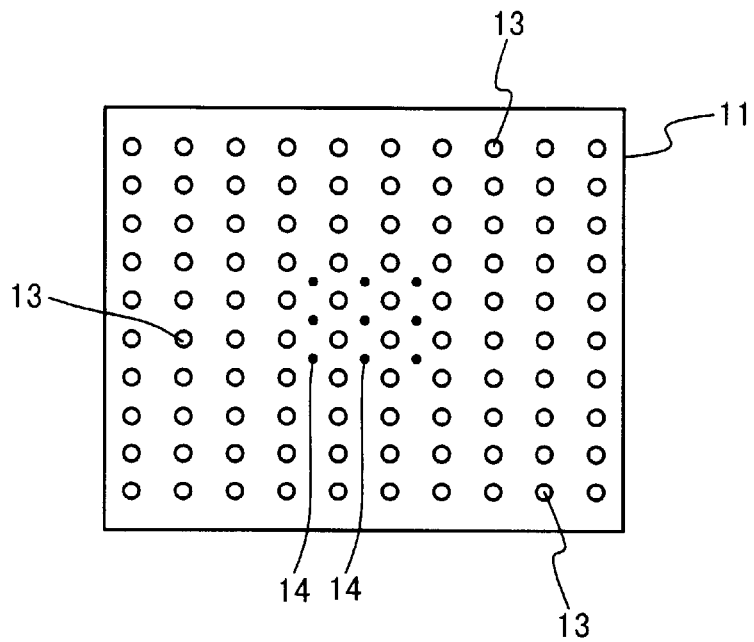
FIGS. 11A and 11B are plan views showing first and second diffusing plates, respectively.
Figure 11B:
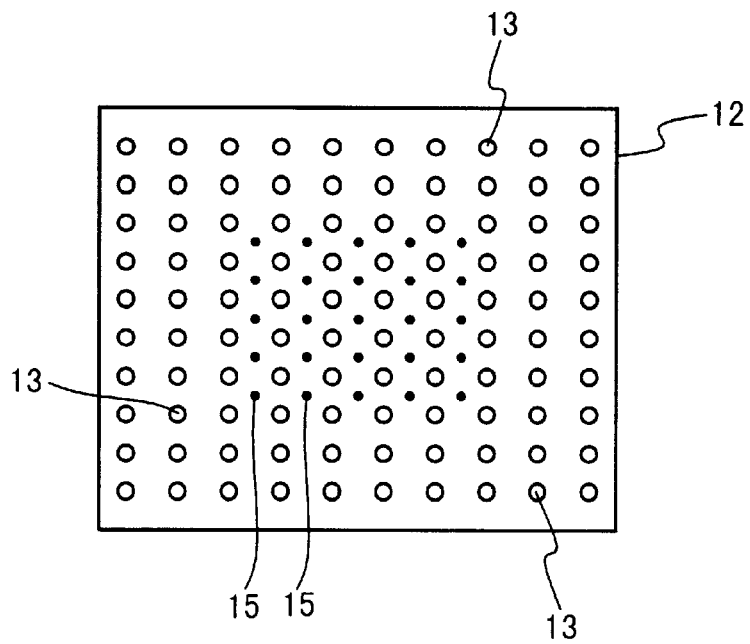

FIG. 11A shows the first gas diffusing plate 11, and FIG. 11B shows the second gas diffusing plate 12. The first neutral gas passage holes 14 are formed in the neighbor of the center of the first gas diffusing plate 11. The second neutral gas passage holes 15 are formed in the second gas diffusing plate 12 on the positions determined based on those of the first neutral gas passage holes 14 of the first gas diffusing plate 11. Further, the second neutral gas passage holes 15 are formed in a region extending outside the region where the first neutral gas passage holes 14 are formed.

As shown in FIG. 9, a mono-silane gas 19 as the neutral gas is supplied from the neutral gas introduction pipe 6 into a space between plasma confining electrode upper plate 8 and first gas diffusing plate 11. The mono-silane gas 19 is made uniform by the first neutral gas passage holes 14 of the first gas diffusing plate 11. The passed mono-silane gas 19 is further made uniform by the second neutral gas passage holes 15 of the second gas diffusing plate 12. The mono-silane gas 19 is injected toward the counter electrode 3 (FIG. 8) uniformly on the substrate surface from the third neutral gas passage holes 16 of the plasma confining electrode lower plate 9. Only the first gas diffusing plate 11 and the second gas diffusing plate 12 are shown in FIG. 9, but the number of diffusing plates is not limited to the two, and may be more. Also, the number of pipes 6 is not limited to 2. It would be more desirable that four or more pipes are used.

A silicon oxide film is formed by such a plasma CVD apparatus. As shown in FIG. 8, an oxygen gas 18 is introduced between the high frequency applied electrode 2 and the plasma confining electrodes 5 in the vacuum chamber 1. Then, the glow discharge is generated to generate oxygen plasma 22 in a plasma generation region. The generated oxygen plasma 22 is efficiently confined between the high frequency applied electrode 2 and the plasma confining electrode 5. As a result, the plasma density in the oxygen plasma 22 is about $10^{10}/cm^3$, while the plasma density between the plasma confining electrode 5 and the counter electrode 3 is $10^5$ to $10^6/cm^3$. In this case, electrons, oxygen atom ions, oxygen molecule ions, oxygen atom radicals, and oxygen molecule radicals exist in the oxygen plasma. However, the electrons and ions going out of the plasma are negligible. Therefore, the oxygen atom radicals and oxygen molecule radicals react with the mono-silane gas 19 and contribute to the formation of the silicon oxide film through the reaction with the mono-silane gas 19. Hereinafter, these radicals are merely referred to as oxygen radicals. The oxygen radicals 21 pass through the radical passage holes 13 to diffuse in the substrate processing region, and react with the mono-silane gas 19 which passes through the third neutral gas passage holes 16 to form the silicon oxide precursor such as SiOx and SiOxHy. Thus, the silicon oxide film is formed on the substrate 4.

As described above, the plasma density between the plasma confining electrode 5 and the counter electrode 3 becomes very low. Therefore, the plasma damage to the substrate 4 becomes very low in the present invention, compared with the conventional parallel plate plasma CVD. This effect appears conspicuously in case of the silicon surface on which a MOS structure is formed. When the silicon oxide ($SiO_2$) film is formed on a single crystal silicon substrate by the conventional parallel plate plasma CVD, a MOS interface trapped charge density is $10^{11}$ to $10^{12}/cm^2/eV$ near the mid-gap. On the other hand, when the silicon oxide film is formed by the parallel plate remote plasma CVD of the present invention, the interface trapped charge density is as low as $10^{10}/cm^2/eV$.

In this way, in the plasma confining electrode 5, it is important how the first and second gas passage holes 14 and 15 are formed in the plurality of gas diffusing plates 11 and 12 which are disposed in the hollow structure between the plasma confining electrode upper plate 8 and the plasma confining electrode lower plate 9. If the holes 14 and 15 are suitably arranged, the injection of the mono-silane gas 19 from the third neutral gas passage holes 16 can be made uniform. Thus, the distribution of the precursor of the silicon oxide on the substrate can be made uniform, so that the uniformity of the silicon oxide film on substrate 4 is improved.

The flow of the mono-silane gas in the plasma confining electrode 5 in the above-mentioned embodiment will be described with reference to FIGS. 12A to 12D.

Figure 12A:
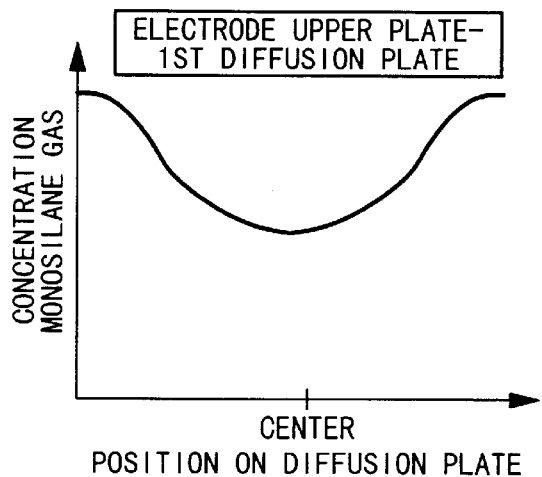
FIGS. 12A, 12B, 12C and 12D are graphs showing concentration distributions of gas passing through the diffusing plate.

(1) The mono-silane gas 19 is supplied between the plasma confining electrode upper plate 8 and the first gas diffusing plate 11. As shown in FIG. 12A, the concentration distribution of the mono-silane gas at this time point is high in the periphery and low in the center.

Figure 12B:
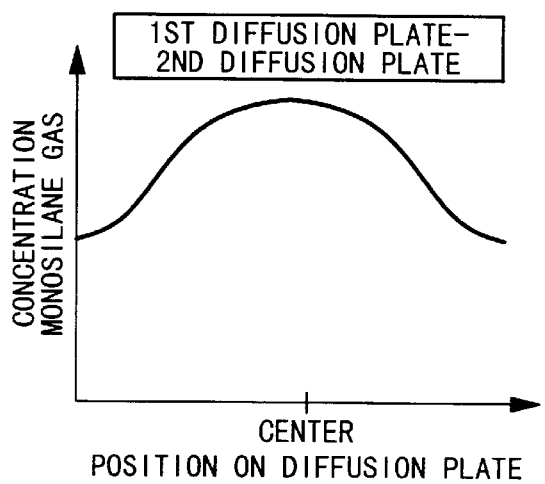

(2) After the mono-silane gas passes through the neutral gas passage holes 14 nearby of the center of the first gas diffusing plate 11, the concentration distribution of the mono-silane gas is low in the periphery and high in the center, as shown in FIG. 12B. The neutral gas introduction pipes 6 do not pass through the plasma generation region, and the distribution of holes in the diffusing plates is improved. In this way, the high gas concentration distribution in the center is realized.

Figure 12C:
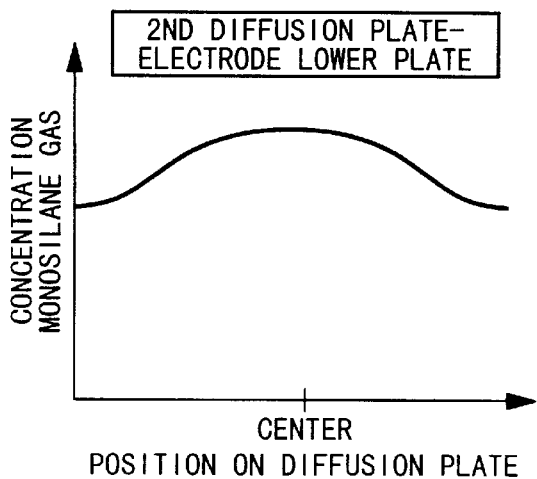

(3) As shown in FIG. 12C, after the mono-silane gas passes through the second neutral gas passage holes 15 of the second gas diffusing plate 12, the concentration distribution of the mono-silane gas has inclination more gentle than the concentration distribution shown in FIG. 12B based on the distribution of the second neutral gas passage holes 15.

Figure 12D:
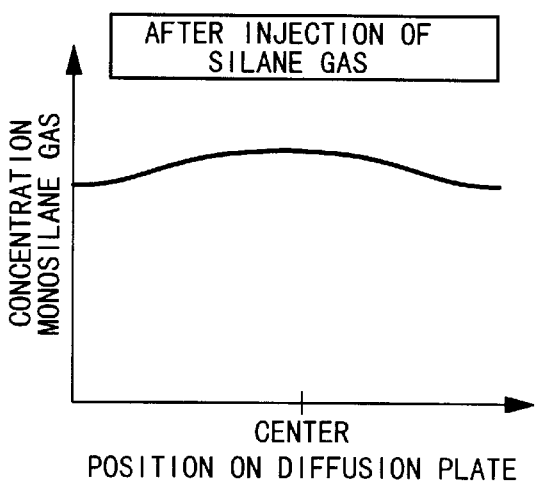

(4) As shown in FIG. 12D, after the mono-silane gas passes through the third neutral gas passage holes 16 of the plasma confining electrode lower plate 9, the concentration distribution of the mono-silane gas becomes further gentle, compared with the concentration distribution shown in FIG. 12C. Thus, approximately uniform gas injection on the substrate surface is carried out.

Figure 13A:
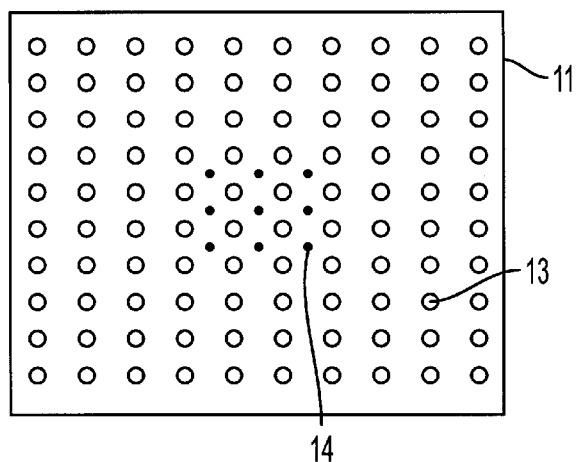
FIGS. 13A, 13B and 13C are plan views showing first, second and third diffusing plates, respectively.
Figure 13B:
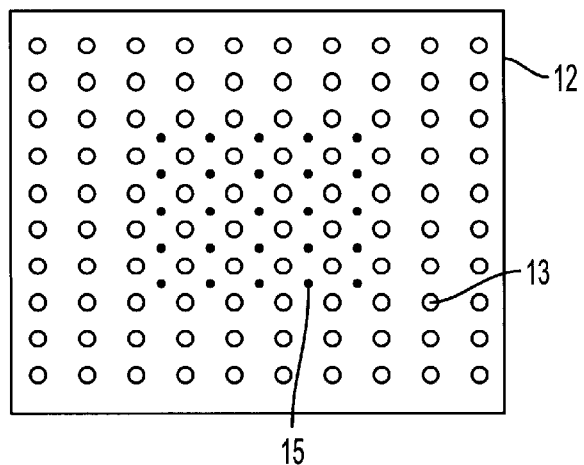
Figure 13C:
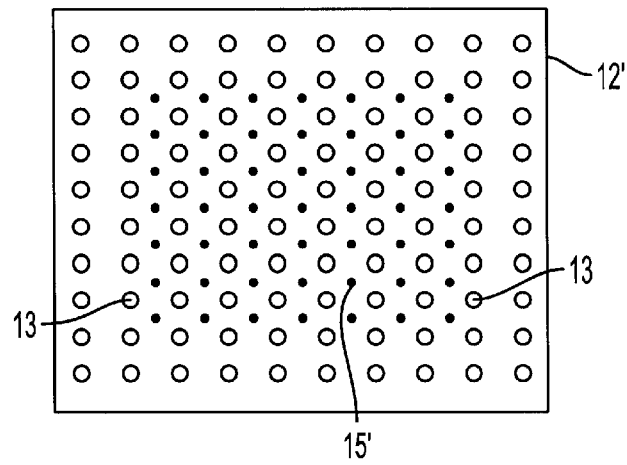

In the above-mentioned embodiment, the two gas diffusing plates are used. However, as shown in FIGS. 13A, 13B and 13C, a third gas diffusing plate 12' may be added. As shown in FIG. 13C, third gas passage holes 15' are formed in the third gas diffusing plate 12' on the positions determined based on those of the second neutral gas passage holes 15 of the second gas diffusing plate 12. Further, the third neutral gas passage holes 15' are formed in a region extending outside the region where the second neutral gas passage holes 15 are formed. For further improvement of the diffusion performance, it is desired that four or more diffusing plates are used. The use of more diffusing plates makes the gas concentration uniform. However, the use of more diffusing plates introduces the complicated structure of the plasma confining electrode 5. Also, the radical passage hole 13 becomes long.

Figure 14A:
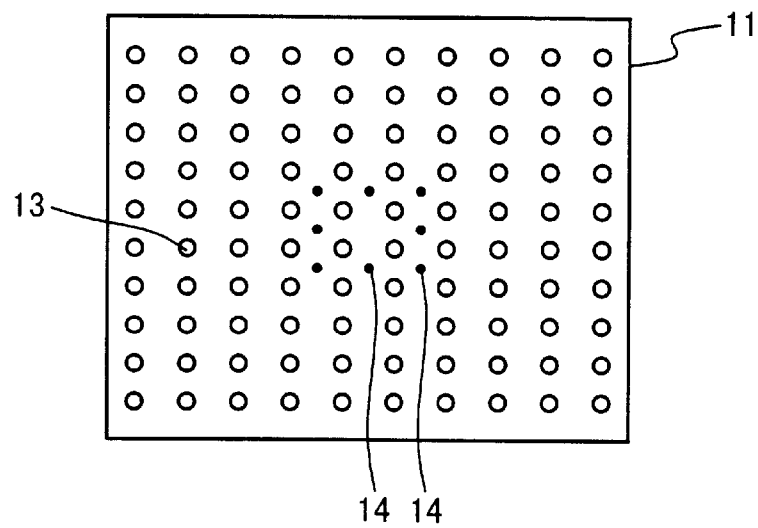
FIGS. 14A and 14B are plan views showing the other first and second diffusing plates, respectively.
Figure 14B:
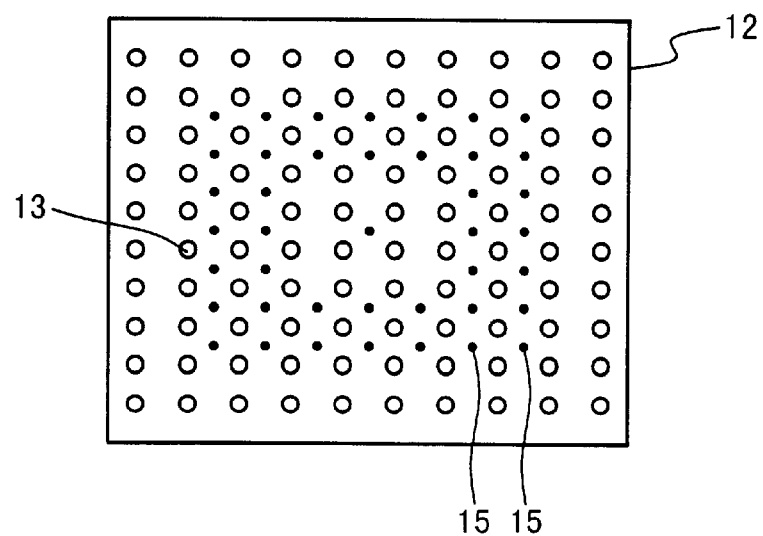

Moreover, in the embodiment shown in FIGS. 14A and 14B, the second neutral gas passage holes 15 are formed on the second diffusing plate 12 in such a manner that the position of the second neutral gas passage holes 15 do not overlap the first neutral gas passage holes 14. When the positions of the neutral gas passage holes overlap, there is a possibility that the gas passage route with the same length as the distance between the diffusing plates exist. A part of the neutral gas passes through the gas passage holes before the gas diffusion into the lateral direction between the gas diffusing plates. In the examples shown in FIGS. 14A and 14B, if the positions of the neutral gas passage holes do not overlap, the gas diffusion into the lateral direction can be promoted.

Figure 15:
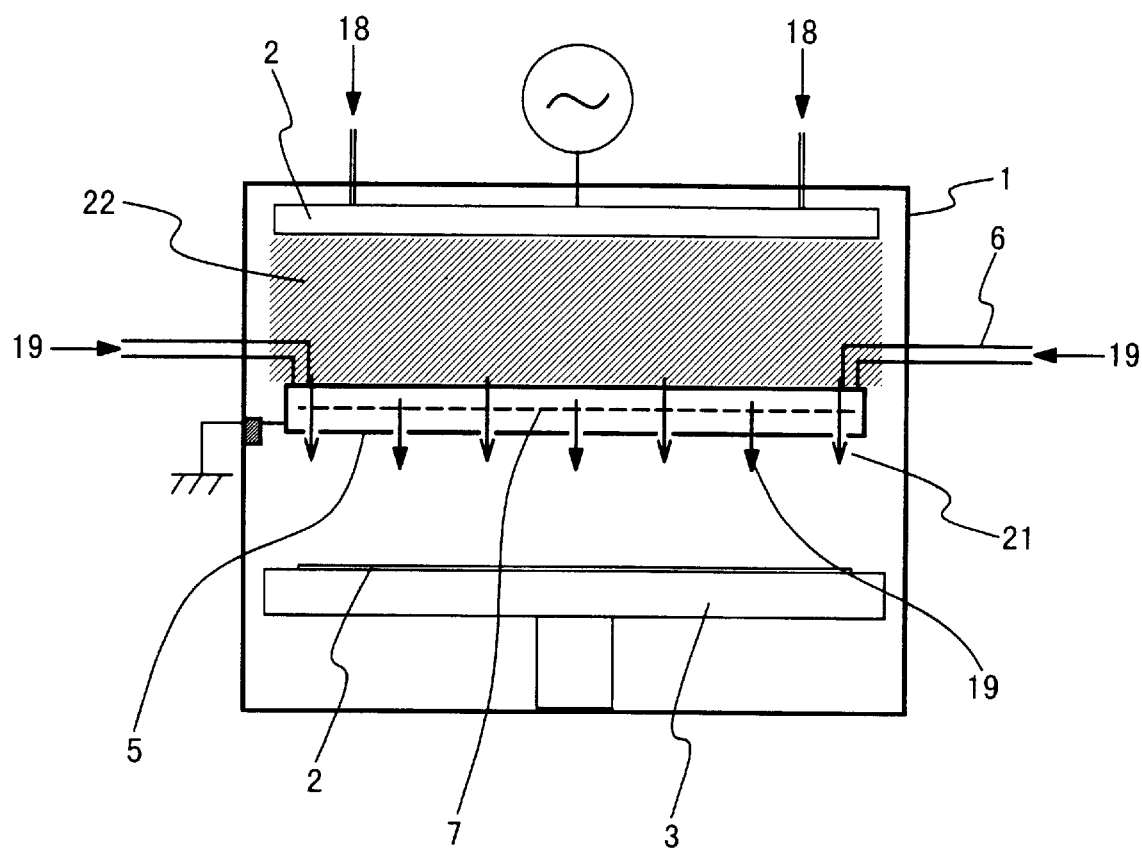
FIG. 15 is a cross sectional view showing the plasma CVD apparatus according to a second embodiment of the present invention.

FIG. 15 shows the structure of the plasma CVD apparatus according to a second embodiment of the present invention. The method of introducing the neutral gas in the second embodiment is different from the method in the first embodiment shown in FIG. 8. Referring to FIG. 15, the neutral gas introduction pipes 6 for neutral gas such as the mono-silane gas are inserted into the vacuum chamber 1 from the side plane of the plasma generation region, and connected with the upper portions of the plasma confining electrode 5. Thus, the neutral gas introduction pipes 6 passes through the plasma generation region. However, the passage region is the peripheral portion of the plasma generation region 22. Therefore, the change of the plasma state is little, even if the abnormal discharge happens, compared with the case where the abnormal discharge happens near the upper surface of the plasma confining electrode.

In this way, if the gas diffusing plates are arranged in the plasma confining electrode 5, the shape and number of gas diffusing plates can be changed according to the necessity without leaving from the scope of the present invention. Also, the shape and number of neutral gas supply pipes in the second embodiment may be changed according to the necessity without leaving from the scope of the present, if the neutral gas is supplied from the outside of the vacuum chamber 1 into the periphery of plasma confining electrode 5 through the peripheral portion of the plasma generation region.

Figure 16:
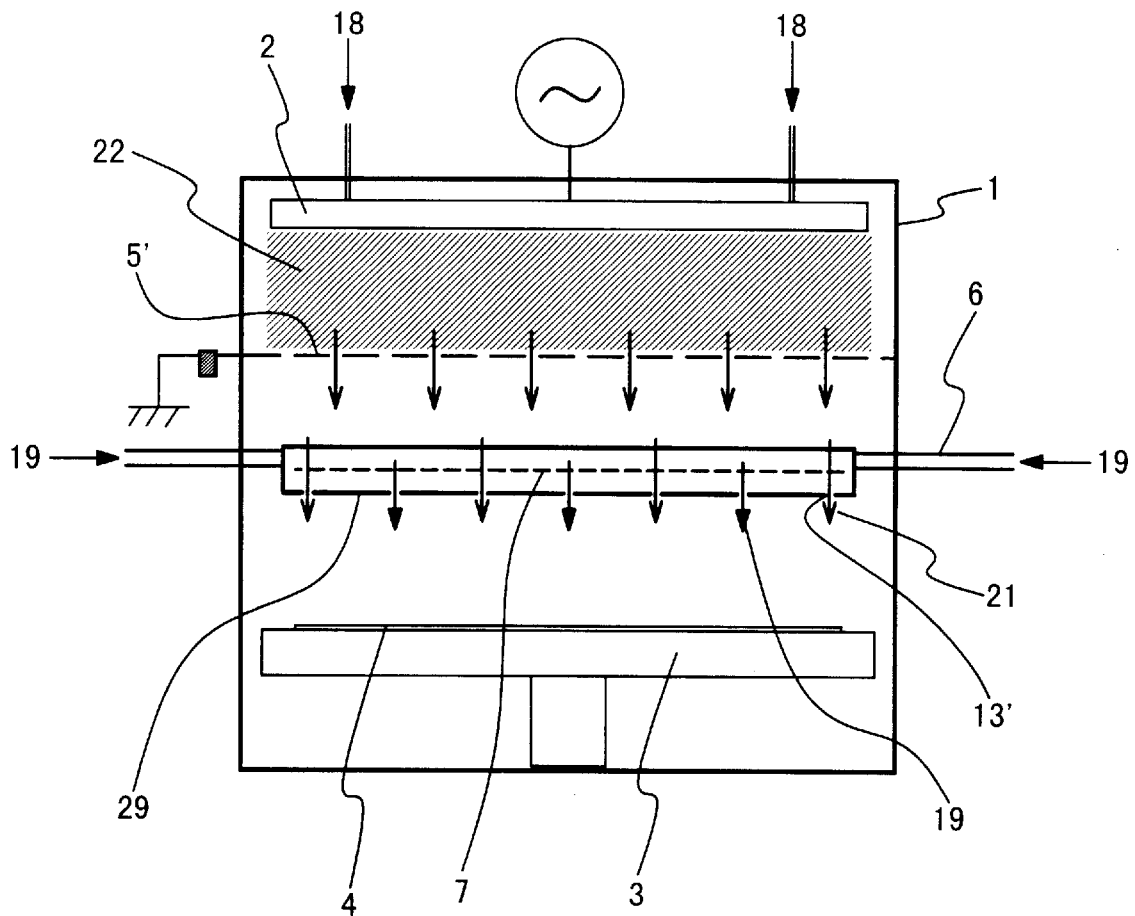
FIG. 16 is a cross sectional view of the plasma CVD apparatus according to a third embodiment of the present invention.

FIG. 16 shows the structure of the plasma CVD apparatus according to a third embodiment of the present invention. The parallel plate remote plasma CVD shown in FIG. 16 is different from that of FIG. 8 in the following points. That is, in the third embodiment, the gas supply plate 29 is used in place of the plasma confining plate 5. The gas supply plate 29 is connected to the neutral gas introduction pipes 6 to supply the neutral gas. Also, the gas supply plate 29 includes the above-mentioned gas diffusing plate section 7. Thus, the gas concentration is made uniform by the gas supply plate 29. The gas supply plate 29 has the same structure of the plasma confined plate 5 shown in FIG. 8 or FIG. 15. Therefore, the examples shown in FIG. 10, FIG. 11, FIG. 13, and FIG. 14 can be applied just as it is, for the diffusing plate section 7 of FIG. 16. If it is possible for the radicals to be uniformly injected, the diameter of each of the radical passage holes 13' of the gas supply plate 29 are optional. Also, it is possible to electrically use the gas supply plate 29 in the electric floating condition without grounding.

In the third embodiment, a plasma confining electrode 5' is provided between the high frequency applied electrode and the gas supply plate 29 to confine the generated plasma. The plasma confining electrode 5' has a plurality of radicals passage holes. Also, the plasma confining electrode 5' is grounded. In the first embodiment of FIG. 8, the plasma confining electrode 5 has the gas diffusing function corresponding to the gas supply plate 29 and the plasma confining function. However, in the third embodiment of FIG. 16, the plasma confining electrode 5' has only the function to confine the plasma. Thus, the gas diffusing function and the plasma confining function are fully separated. Also, the third embodiment can be applied to the second embodiments.

In the above embodiments, the example in which the silicon oxide film is formed using the mono-silane and the oxygen gas is described. However, liquid Si materials such as the high order silanes such as disilane and TEOS (Tetraethoxysilane) in place of mono-silane may be used. Also, nitrogen oxide may be used in place of oxygen. Further, the same advantage can be attained with respect to the formation of the plasma CVD films using the other materials such as a silicon nitride film using the mono-silane and ammonia, an amorphous silicon film using the mono-silane and hydrogen or inert gas, in place of the formation of the silicon oxide film.

Moreover, the parallel plate remote plasma CVD apparatus is described. The plasma CVD apparatus has the plasma confining electrode for the plasma separation provided between the plasma generation region and the substrate processing region and having the plurality of holes. The present invention can be applied to any types of plasma CVD apparatus such as a plasma CVD apparatus which uses microwave plasma, electron cyclotron resonance plasma, inductive coupling plasma, and helicon wave plasma.

As described above, a total opening area of the plurality of neutral gas passage holes in the gas diffusing plate on a side of the upper electrode plate may be smaller than that of the plurality of neutral gas passage holes in the gas diffusing plate on a side of the lower electrode plate. Also, the number of the neutral gas passage holes in the gas diffusing plate on the side of the lower electrode plate may be more than the number of the neutral gas passage holes in the gas diffusing plate on the side of the upper electrode plate. In addition, first ones of the plurality of neutral gas passage holes in each of the gas diffusing plates may be different in diameter from second ones of the plurality of neutral gas passage holes in each of the gas diffusing plates.

Also, positions of the neutral gas passage holes in the gas diffusing plate nearer to the lower electrode plate may be different from positions of the neutral gas passage holes in the gas diffusing plate nearer to the upper electrode plate. In this case, a region of the neutral gas passage holes in the gas diffusing plate nearer to the lower electrode plate may be arranged in an outside region of a region of the neutral gas passage holes in the gas diffusing plate nearer to the upper electrode plate.

Also, a distribution density of the plurality of neutral gas passage holes is higher in a central portion of each of the gas diffusing plates than in a peripheral portion thereof.

In the plasma CVD apparatus of the present invention, the concentration of the neutral gas which is injected into the substrate processing region can be made uniform in the surface.

In the present invention, it is not necessary to pass the gas introduction pipe through the plasma generation region, specifically, near the center of the plasma generation region. Therefore, the abnormal discharge never occurs to make the plasma state unstable. The uniform passage of the neutral gas on the substrate surface becomes possible in this way. Therefore, the high quality film which does not have a defect due to the plasma damage can be uniformly formed on the large area substrate in the case that a MOS device gate insulating film and an interlayer insulating film are formed, and a thin-film transistor device silicon film and a nitride silicon film are formed.

What is claimed is:

1. A plasma CVD apparatus comprising a plasma confining electrode for plasma separation provided between a plasma generation region and a substrate processing region to have a plurality of radical passage holes,
   wherein said plasma confining electrode is a hollow structure,
   neutral gas passage holes are provided for said plasma confining electrode on a side of said substrate processing region,
   a plurality of gas diffusion plates having neutral gas passage holes are provided in said plasma confining electrode,
   gas introduction pipes, which extend from a lateral direction of said plasma confining electrode to be coupled to side portions of said plasma confining electrode and are provided to supply gas such that a concentration distribution of a neutral gas between an upper plate of said plasma confining electrode and said gas diffusion plate on a side of said plasma generation region is higher in an outer region and lower in a center region,
   a total opening area of said neutral gas passage holes of said plurality of gas diffusion plates is higher on a side of said substrate processing region than that of said neutral gas passage holes on the side of said plasma generation region, and
   a distribution of the total opening area of said neutral gas passage holes for each of said plurality of gas diffusion plates is lower in said outer region and higher in said center region.

2. The plasma CVD apparatus according to claim 1, wherein the number of said neutral gas passage holes of said plurality of gas diffusing plates on the side of said substrate processing region is more than the number of said neutral gas passage holes in said gas diffusing plate on the side of said plasma generating region.

3. The plasma CVD apparatus according to claim 1, wherein first ones of said plurality of neutral gas passage holes in each of said gas diffusing plates are different in diameter from second ones of said plurality of neutral gas passage holes in each of said gas diffusing plates.

4. The plasma CVD apparatus according to claim 1, wherein positions of said neutral gas passage holes of said plurality of gas diffusing plates nearer to said substrate processing region are different from positions of said neutral gas passage holes of said plurality of gas diffusing plates nearer to said plasma generating region.

5. The plasma CVD apparatus according to claim 4, wherein a region of said neutral gas passage holes of said gas diffusing plates nearer to said substrate processing region is arranged in an outside region of a region of said neutral gas passage holes in said gas diffusing plate nearer to said plasma generating region.

6. A plasma CVD apparatus comprising a plasma confining electrode for plasma separation provided between a plasma generation region and a substrate processing region to have a plurality of radical passage holes,
   wherein said plasma confining electrode is a hollow structure,
   neutral gas passage holes are provided for said plasma confining electrode on a side of said substrate processing region,
   a plurality of gas diffusion plates having neutral gas passage holes are provided in said plasma confining electrode,
   a gas introduction pipe, which extends from a lateral direction of said plasma confining electrode to be coupled to upper portions of said plasma confining electrode, and is provided to supply gas such that a concentration distribution of a neutral gas between an upper plate of said plasma confining electrode and a first one of said plurality of gas diffusion plates is higher in an outer region and lower in a center region,
   a total opening area of said neutral gas passage holes of said plurality of gas diffusion plates is higher on a side of said substrate processing region than that of said neutral gas passage holes on the side of said plasma generation region, and
   a distribution of the total opening area of said neutral gas passage holes for each of said plurality of gas diffusion plates is lower in said outer region and higher in said center region.

7. The plasma CVD apparatus according to claim 6, wherein the number of said neutral gas passage holes of said plurality of gas diffusing plates on the side of said substrate processing region is more than the number of said neutral gas passage holes of said plurality of gas diffusing plates on the side of said plasma generating region.

8. The plasma CVD apparatus according to claim 6, wherein first ones of said plurality of neutral gas passage holes in each of said gas diffusing plates are different in diameter from second ones of said plurality of neutral gas passage holes in each of said gas diffusing plates.

9. The plasma CVD apparatus according to claim 6, wherein positions of said neutral gas passage holes of said plurality of gas diffusing plates nearer to said substrate processing region are different from positions of said neutral gas passage holes of said plurality of gas diffusing plates nearer to said plasma generating region.

10. The plasma CVD apparatus according to claim 9, wherein a region of said neutral gas passage holes of said plurality of gas diffusing plates nearer to said substrate processing region is arranged in an outside region of a region of said neutral gas passage holes of said plurality of gas diffusing plates nearer to said plasma generating region.

\* \* \* \* \*